(12) United States Patent
Chang et al.

(10) Patent No.: US 7,638,881 B2
(45) Date of Patent: Dec. 29, 2009

(54) CHIP PACKAGE

(75) Inventors: Chia-Jung Chang, Hsin-Tien (TW); Kwun-Yao Ho, Hsin-Tien (TW); Moriss Kung, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 276 days.

(21) Appl. No.: 11/475,400

(22) Filed: Jun. 26, 2006

(65) Prior Publication Data

US 2007/0222072 A1 Sep. 27, 2007

(30) Foreign Application Priority Data

Mar. 24, 2006 (TW) .............................. 95110239 A

(51) Int. Cl.
*H01L 23/48* (2006.01)
*H01L 23/52* (2006.01)
*H01L 29/40* (2006.01)

(52) U.S. Cl. ....................................... 257/778; 257/786

(58) Field of Classification Search ................. 257/780, 257/781, 784, 786, 778
See application file for complete search history.

(56) References Cited

U.S. PATENT DOCUMENTS

| | | | | |
|---|---|---|---|---|
| 4,963,002 A | * | 10/1990 | Tagusa et al. | ............... 349/149 |
| 5,615,031 A | * | 3/1997 | Saiuchi et al. | ............... 349/149 |
| 6,111,628 A | * | 8/2000 | Shiota et al. | ................ 349/150 |
| 7,129,586 B2 | * | 10/2006 | Kashiwazaki | ............... 257/778 |
| 2003/0062623 A1 | * | 4/2003 | Ono et al. | .................... 257/737 |
| 2004/0262753 A1 | * | 12/2004 | Kashiwazaki | ............... 257/734 |
| 2007/0182019 A1 | * | 8/2007 | Nishimura | ................... 257/777 |

* cited by examiner

*Primary Examiner*—S. V Clark
(74) *Attorney, Agent, or Firm*—J.C. Patents

(57) ABSTRACT

A chip package including a chip, a package substrate, and a plurality of bumps is provided. The chip has a plurality of chip pads disposed on a surface of the chip. The package substrate has a plurality of first substrate pads, a plurality of second substrate pads, and a surface bonding layer. The first substrate pads and second substrate pads are disposed on a surface of the package substrate. The surface bonding layer is disposed on the first substrate pads and second substrate pads, and covers a part of each second substrate pad. The bumps are respectively disposed between the chip pads and the surface bonding layer. The chip is electrically connected to the package substrate through the bumps. Each first substrate pad is electrically connected to one of the bumps, and each second substrate pad is electrically connected to at least two of the bumps.

15 Claims, 17 Drawing Sheets

CHIP PACKAGE

CROSS-REFERENCE TO RELATED APPLICATION

This application claims the priority benefit of Taiwan application serial no. 95110239, filed on Mar. 24, 2006. All disclosure of the Taiwan application is incorporated herein by reference.

BACKGROUND OF THE INVENTION

1. Field of Invention

The present invention relates to a semiconductor device and the fabricating method thereof, and more particularly to a chip package and the fabricating method thereof.

2. Description of Related Art

In the semiconductor industry, the manufacture of integrated circuits (IC) is mainly divided into three stages, namely IC design, IC process, and IC package.

During the fabrication of ICs, a chip is obtained through steps of wafer fabrication, IC forming, and wafer dicing. The wafer has an active surface which generally refers to the surface of the wafer with active devices. After the IC on the wafer is finished, a plurality of chip pads is disposed on the active surface of the wafer, such that the chip formed finally through wafer dicing is electrically connected to a carrier through the chip pads. The carrier is, for example, a leadframe or a package substrate. The chip is connected to the carrier by means of wire bonding or flip chip bonding, so as to make the chip pads of the chip electrically connected to the contact of the carrier. Thus, a chip package is formed.

As for the flip chip bonding technology, usually after the chip pads are formed on the active surface of the wafer, a bump is fabricated on each of the chip pads for use in electrically connecting the chip to the external package substrate. Since the bumps are usually arranged on the active surface of the chip in a plane array, the flip chip bonding technology is suitable for chip packages of high contact number and high contact density, for example, a flip chip/ball grid array package commonly used in the semiconductor package industry. Besides, compared with the wire bonding technology, the flip chip bonding technology may enhance the electrical performance of the chip package because the bumps provide a short transmission path between the chip and the carrier.

Referring to FIG. 1, it is a sectional view of a conventional chip package. A conventional chip package 100 includes a chip 110, a package substrate 120, a plurality of bumps 130, and an interface metal layer 140. The chip 110 has a plurality of chip pads 112 disposed on a surface 114 of the chip 110. The package substrate 120 has a plurality of first substrate pads 122, a plurality of second substrate pads 124, and a surface bonding layer 126. The first substrate pads 122 and the second substrate pads 124 are disposed on a surface 128 of the package substrate 120. The surface bonding layer 126 (the material thereof is Sn) is disposed on the first substrate pads 122 and the second substrate pads 124, and the layer 126 also completely covers the first substrate pads 122 and the second substrate pads 124.

The bumps 130 are respectively disposed between the chip pads 112 and the surface bonding layer 126. The interface metal layer 140 is disposed between the bumps 130 and the surface bonding layer 126. The chip 110 is electrically connected to the package substrate 120 through the bumps 130. Additionally, each first substrate pad 122 is electrically connected to one of the bumps 130, and each second substrate pad 124 is electrically connected to two or more of the bumps 130.

It should be noted that the surface bonding layer 126 is used to provide a better bonding between the bumps 130 and the correspondingly-connected first substrate pads 122 or second substrate pads 124.

In general, the surface area of the surface bonding layer 126 formed on the second substrate pads 124 is much larger than the total contact surface area of the connected bumps 130, while the surface area of the surface bonding layer 126 formed on the first substrate pads 122 is slightly larger than the contact surface area of the connected bumps 130.

The conventional chip package 100 is formed by a thermal compression bonding process. In particular, after the bumps 130 are respectively formed on the chip pads 112 in advance, and the surface bonding layer 126 is formed on the first substrate pads 122 and the second substrate pads 124, each of the bumps 130 is then pressed onto one of the first substrate pads 122 or of the second substrate pads 124 by means of high-temperature compression. Each of the bumps 130 chemically reacts with the surface bonding layer 126 to form the interface metal layer 140, so that the chip 110 is electrically connected to the package substrate 120.

During the thermal compression bonding process, as the surface area of the surface bonding layer 126 formed on the first substrate pads 122 is slightly larger than the contact surface area of the connected bumps 130, the contact surface area may be quickly increased to be equal to the surface area of the surface bonding layer 126 formed on the first substrate pads 122. As such, the material of the surface bonding layer 126 may be completely used to connect the bumps 130.

However, as for the second substrate pads 124, the overall contact surface area of the bumps 130 may not be increased to be equal to the surface area of the surface bonding layer 126 formed on the second substrate pads 124, so parts of the surface bonding layer 126 respectively disposed on the second substrate pads 124 in a melting state rises along the side of the bumps 130 toward the chip 110 and further contaminates the chip 110.

SUMMARY OF THE INVENTION

The present invention provides a chip package, which comprises a chip, a package substrate, and a plurality of bumps. The chip has a plurality of chip pads disposed on a surface of the chip. The package substrate has a plurality of first substrate pads, a plurality of second substrate pads, and a surface bonding layer. The first substrate pads and the second substrate pads are disposed on a surface of the package substrate. The surface bonding layer is disposed on the first substrate pads and the second substrate pads and covers the first region of the second substrate pad. The bumps are respectively disposed between the chip pads and the surface bonding layer. The chip is electrically connected to the package substrate through the bumps. Each first substrate pad is electrically connected to one of the bumps and each second substrate pad is electrically connected to at least two of the bumps.

The present invention provides a method of fabricating the chip package, which comprises the following steps. First, a chip is provided, which has a plurality of chip pads and a plurality of bumps, wherein the chip pads are disposed on a surface of the chip, and the bumps are disposed on the chip pads. Then, a package substrate is provided, which has a plurality of first substrate pads and a plurality of second substrate pads, wherein the first substrate pads and the second substrate pads are disposed on a surface of the package substrate. After that, a surface bonding layer is formed on the first substrate pads and the second substrate pads. Then, a thermal compression bonding process is performed to make the bumps bonded to the surface bonding layer. As such, each first substrate pad is electrically connected to one of the bumps, and each second substrate pad is electrically connected to at least two of the bumps.

The present invention provides a method of fabricating the chip package, which comprises the following steps. First, a chip is provided, which has a plurality of chip pads and a plurality of bumps, wherein the chip pads are disposed on a surface of the chip, and the bumps are respectively disposed on the chip pads. Then, a package substrate is provided, which has a plurality of first substrate pads and a plurality of second substrate pads, wherein the first substrate pads and the second substrate pads are disposed on a surface of the package substrate. Next, a first solder mask layer is formed on the second substrate pads. After that, the first solder mask layer is patterned to have a plurality of openings to expose a part of the second substrate pads respectively. Then, a surface bonding layer is formed on the first substrate pads and the second substrate pads, wherein parts of the surface bonding layer are formed in the openings respectively. Next, a thermal compression bonding process is performed to make the bumps bonded to the surface bonding layer. As such, each first substrate pad is electrically connected to one of the bumps, and each second substrate pad is electrically connected to at least two of the bumps.

In order to the make aforementioned and other features and advantages of the present invention more comprehensible, a plurality of embodiments accompanied with figures is described in detail below.

DESCRIPTION OF EMBODIMENTS

The First Embodiment

Figure 1:
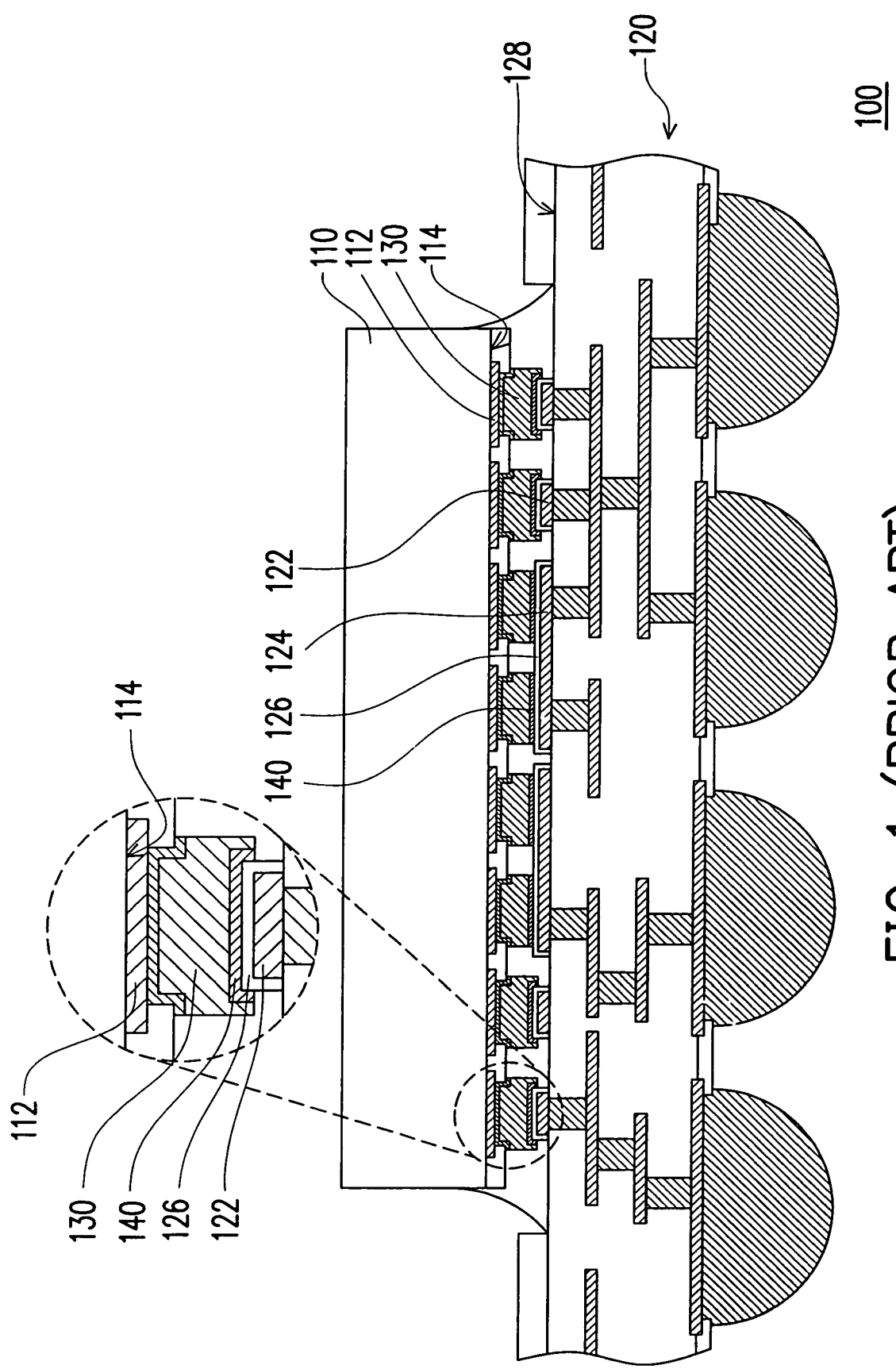
FIG. 1 is a sectional view of the conventional chip package.
Figure 2:
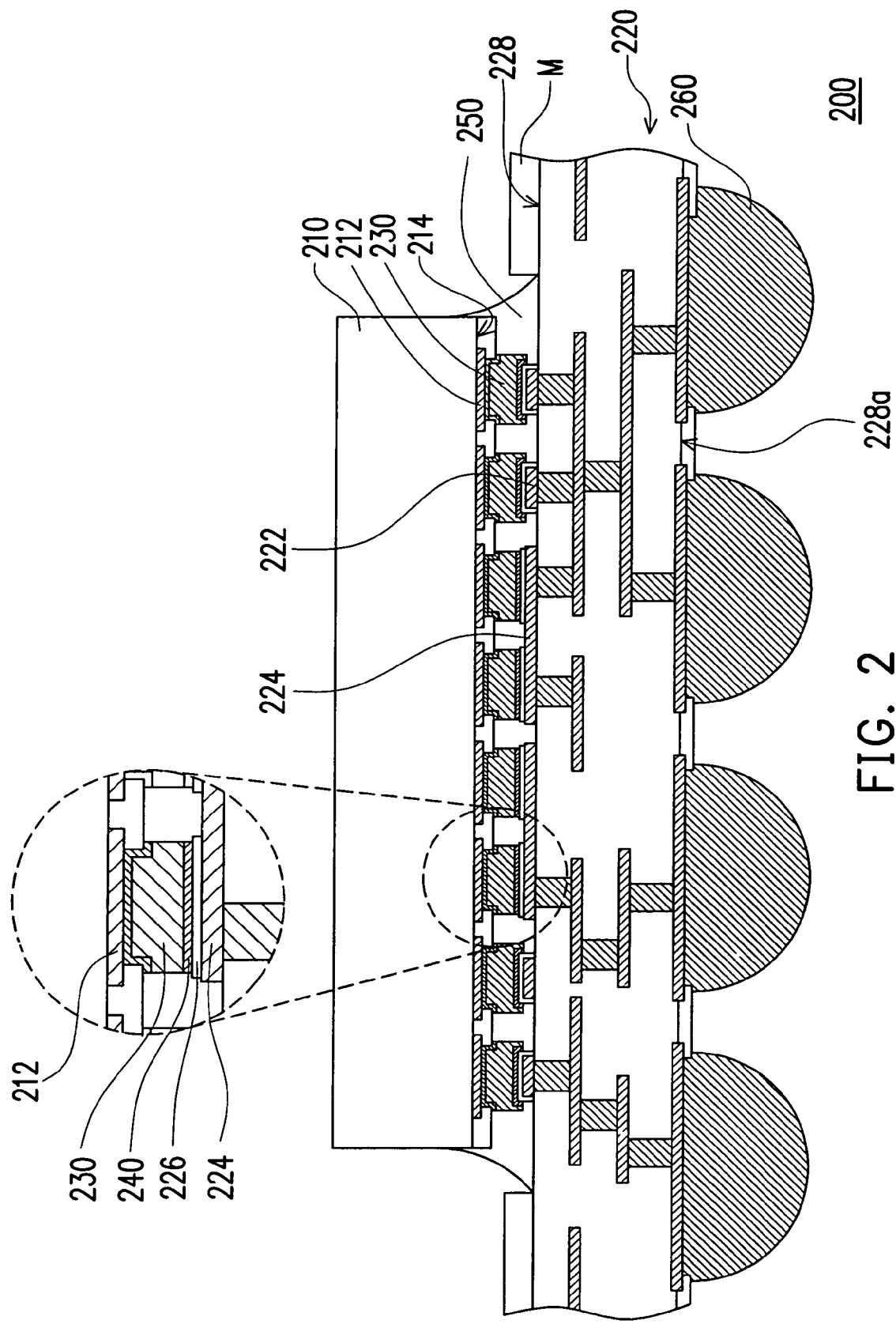
FIG. 2 is a sectional view of a chip package according to the first embodiment of the present invention.

Referring to FIG. 2, it is the sectional view of a chip package according to the first embodiment of the present invention. In the first embodiment, a chip package 200 comprises a chip 210, a package substrate 220, and a plurality of bumps 230. The chip 210 has a plurality of chip pads 212 that are, for example, disposed on a surface 214 of the chip 210 in a plane array. The package substrate 220 has a plurality of first substrate pads 222, a plurality of second substrate pads 224, and a surface bonding layer 226. The first substrate pads 222 and the second substrate pads 224 are disposed on a surface 228 of the package substrate 220. The surface bonding layer 226 is disposed on the first substrate pads 222 and the second substrate pads 224, and the layer 226 covers a part of each second substrate pad 224.

The bumps 230 are respectively disposed between the chip pads 212 and the surface bonding layer 226. The chip 210 is electrically connected to the package substrate 220 through the bumps 230. Each first substrate pad 222 (for example, signal pad) is electrically connected to one of the bumps 230, and each second substrate pad 224 (for example, power supply pad or ground pad) is electrically connected to at least two of the bumps 230. It should be noted that the surface bonding layer 226 is used to provide a better bonding between the bumps 230 and the correspondingly connected first substrate pads 222 or second substrate pads 224.

In the first embodiment, the material of the surface bonding layer 226 is, for example, Sn, Sn-base alloys, or Sn-base compounds, and the thickness thereof is, for example, less than 5 µm. The package substrate 220 includes a solder mask layer M disposed on the surface 228 of the package substrate 220 and exposing the first substrate pads 222 and the second substrate pads 224. The solder mask layer M is used to protect surface lines (not shown) in other areas of the surface 228 of the package substrate 220. In FIG. 2, each first substrate pad 222 may be partially embedded in each of the correspondingly connected bumps 230, so as to provide a better bonding between each first substrate pad 222 and each correspondingly connected bump 230. Additionally, the shape of the bumps 230 may be spherical, ellipsoidal, or columnar, and the material thereof may be a lead-free material, for example, Au, Cu, Sn, Ni, or alloys or compounds of Au, Cu, Sn, or Ni.

The materials mentioned in the first embodiment may be applied to subsequent embodiments, and the dimension mentioned in the first embodiment may also be applied to subsequent embodiments.

In the first embodiment, the chip package 200 further comprises an interface metal layer 240, an underfill layer 250, and a plurality of electrical contacts 260. The interface metal layer 240 is disposed between the bumps 230 and the surface bonding layer 226, and the melting point of the interface metal layer 240 is lower than that of the bumps 230. The underfill layer 250 is disposed between the chip 210 and the package substrate 220, and covers the bumps 230. The underfill layer 250 is used to protect the bumps 230 and to alleviate the mismatch of the thermal strains generated by heating the package substrate 220 and the chip 210.

Besides, the electrical contacts 260 are disposed on a surface 228a of the package substrate 220 away from the chip 210 to electrically connect other electronic devices (not shown). The electrical contacts 260 of the first embodiment are conductive balls for providing signal input/output interfaces of ball grid array (BGA). Moreover, the electrical contacts 260 may also be conductive pins or conductive columns for respectively providing signal input/output interfaces of pin grid array (PGA) or column grid array (CGA) (both not shown).

The method of fabricating the chip package 200 is illustrated as follows. FIGS. 3A to 3E are sectional views of the method of fabricating the chip package in FIG. 2.

Figure 3A:
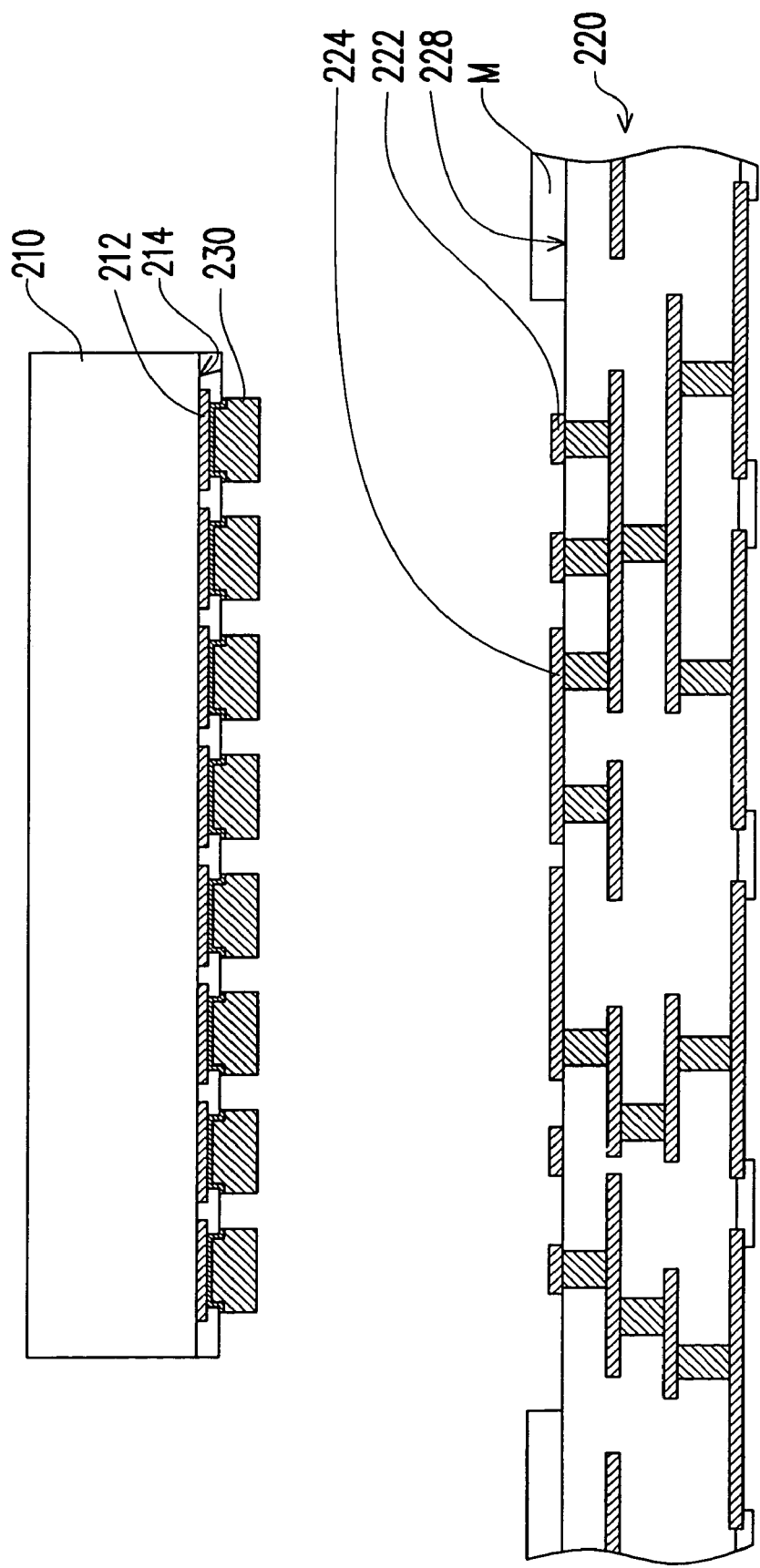
FIGS. 3A to 3E are sectional views of the method of fabricating the chip package in FIG. 2.

First, referring to FIG. 3A, a chip 210 is provided. The chip 210 has a plurality of chip pads 212 and a plurality of bumps 230. The chip pads 212 are disposed on a surface 214 of the chip 210, and the bumps 230 are respectively disposed on the chip pads 212.

Then, a package substrate 220 is provided. The package substrate 220 has a plurality of first substrate pads 222 and a plurality of second substrate pads 224. The first substrate pads 222 and the second substrate pads 224 are disposed on a surface 228 of the package substrate 220. Besides, the package substrate 220 includes a solder mask layer M disposed on the surface 228 of the package substrate 220 and exposing the first substrate pads 222 and the second substrate pads 224.

Figure 3B:
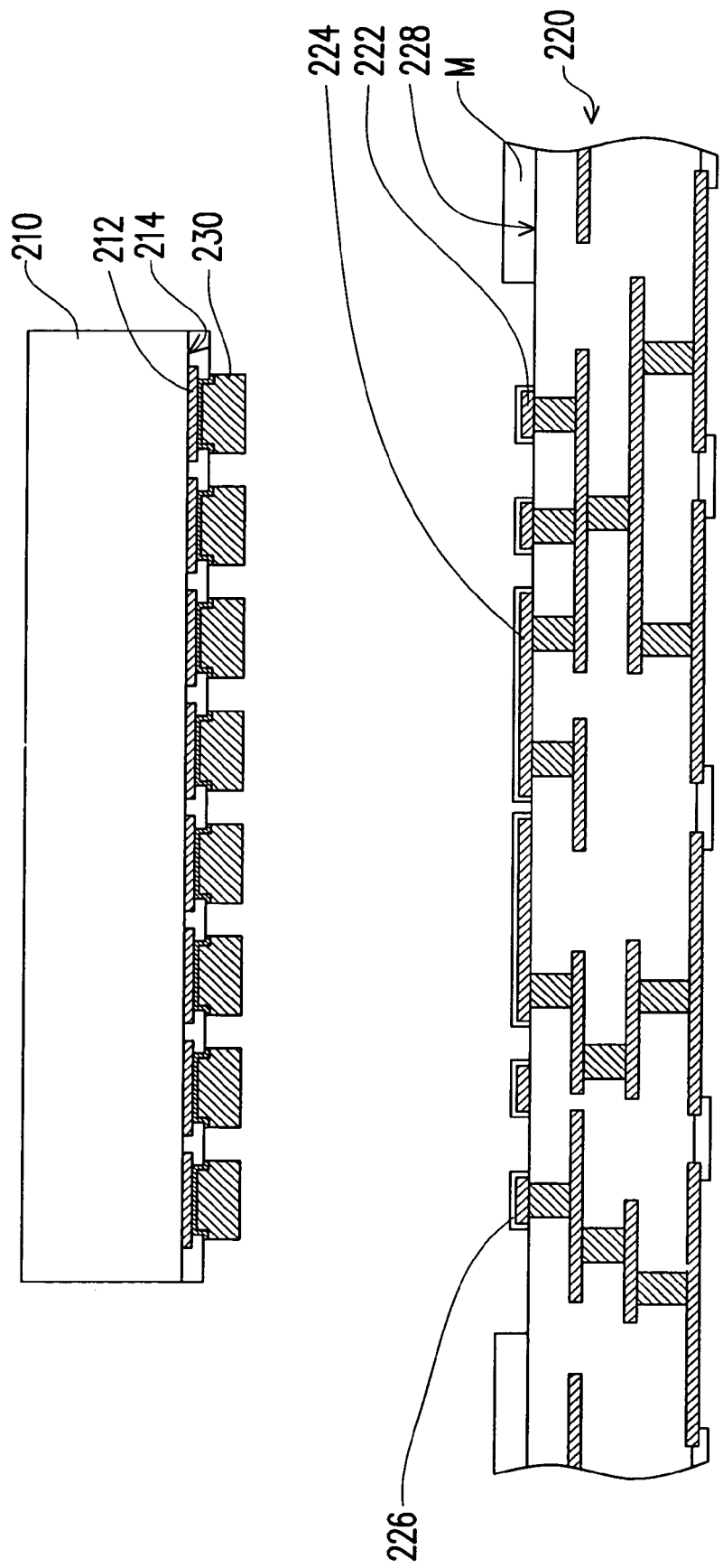

Afterward, referring to FIG. 3B, a surface bonding layer 226 is formed on the first substrate pads 222 and the second substrate pads 224 by means of plating or methods other than plating.

Figure 3C:
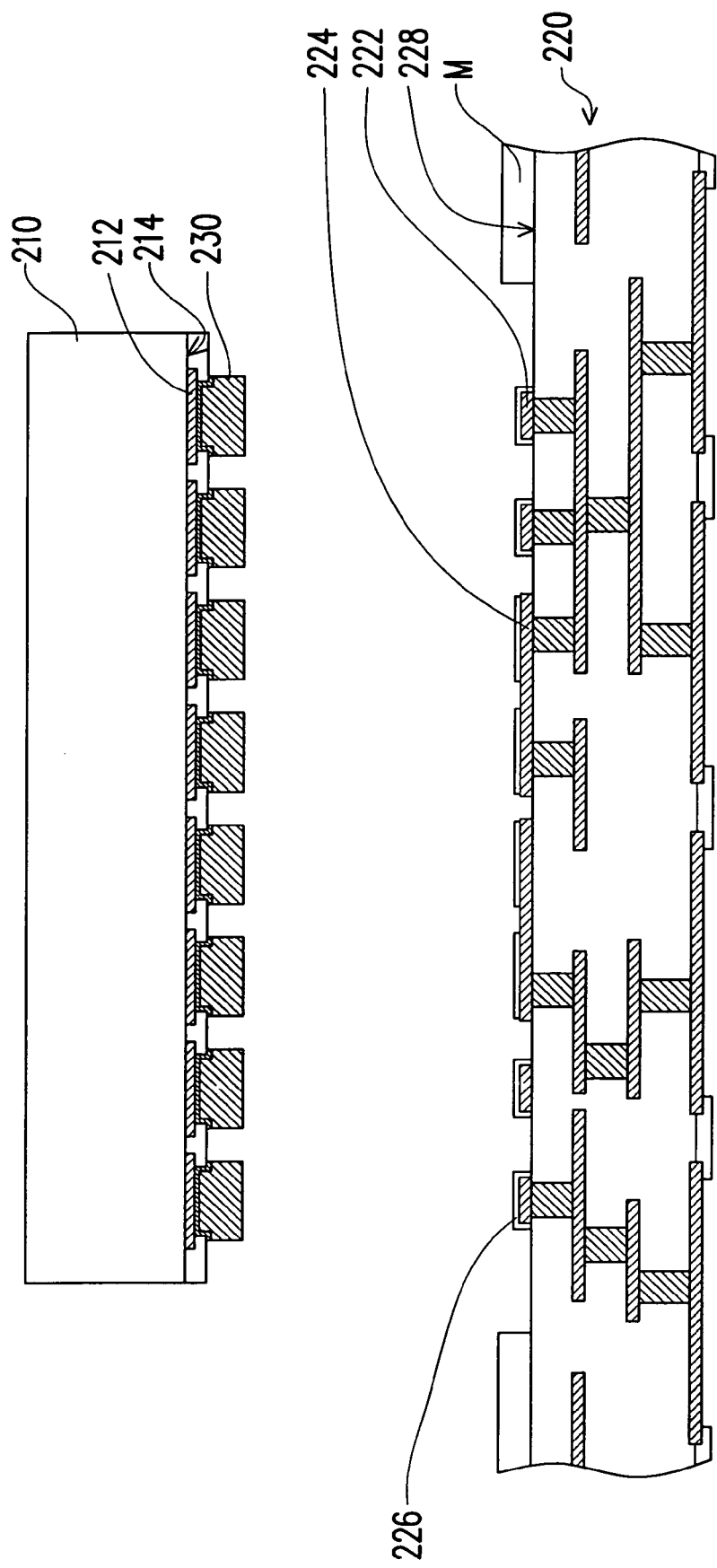

Next, referring to FIG. 3C, the surface bonding layer 226 disposed on the second substrate pads 224 is patterned through lithography and etching processes to expose a part of each of the second substrate pads 224.

Figure 3D:
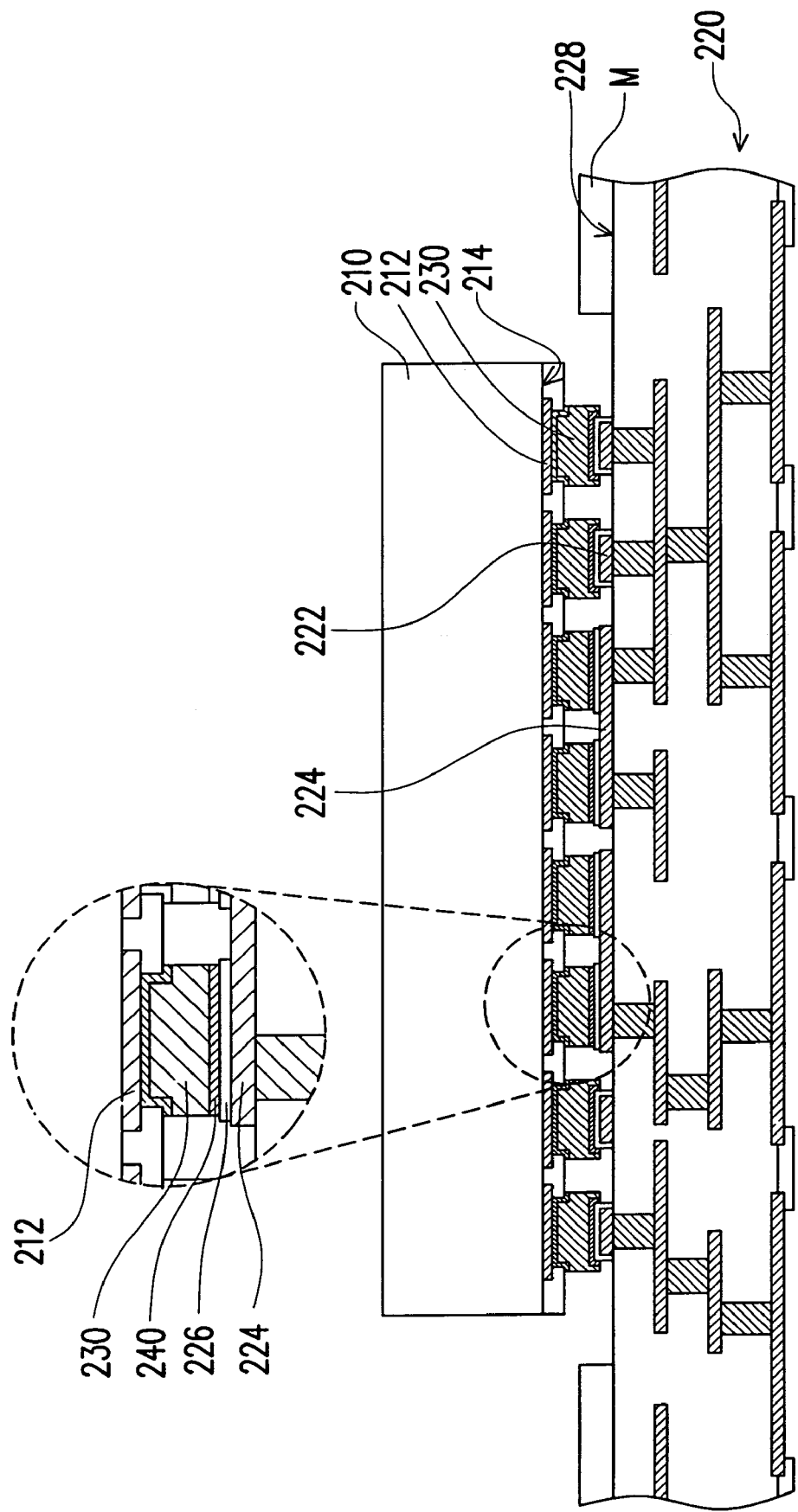

Then referring to FIG. 3D, a thermal compression bonding process is performed to make the bumps 230 bonded to the surface bonding layer 226. Each first substrate pad 222 is electrically connected to one of the bumps 230, and each second substrate pad 224 is electrically connected to at least two of the bumps 230. Additionally, the melting point of the bumps 230 is at least 50° C. higher than an operation temperature of the thermal compression bonding process, i.e., a temperature for pressing the bumps 230 and the first substrate pads 222 or second substrate pads 224. During the thermal compression bonding process as shown in FIG. 3D, when the bumps 230 are bonded to the surface bonding layer 226, the bumps 230 chemically react with the surface bonding layer 226 to form an interface metal layer 240.

It should be noted that, the surface bonding layer 226 on the second substrate pads 224, which is in an area not correspondingly connected to the bumps 230, is almost removed through the patterning step as shown in FIG. 3B, so in the thermal compression bonding process shown in FIG. 3D, the surface bonding layer 226 on the second substrate pads 224 is not easily to rise along the side of the bumps 230 toward the chip 210 through the effect of surface tension. Thus, the surface bonding layer 226 on the second substrate pads 224 does not contaminate the chip 210.

Figure 3E:
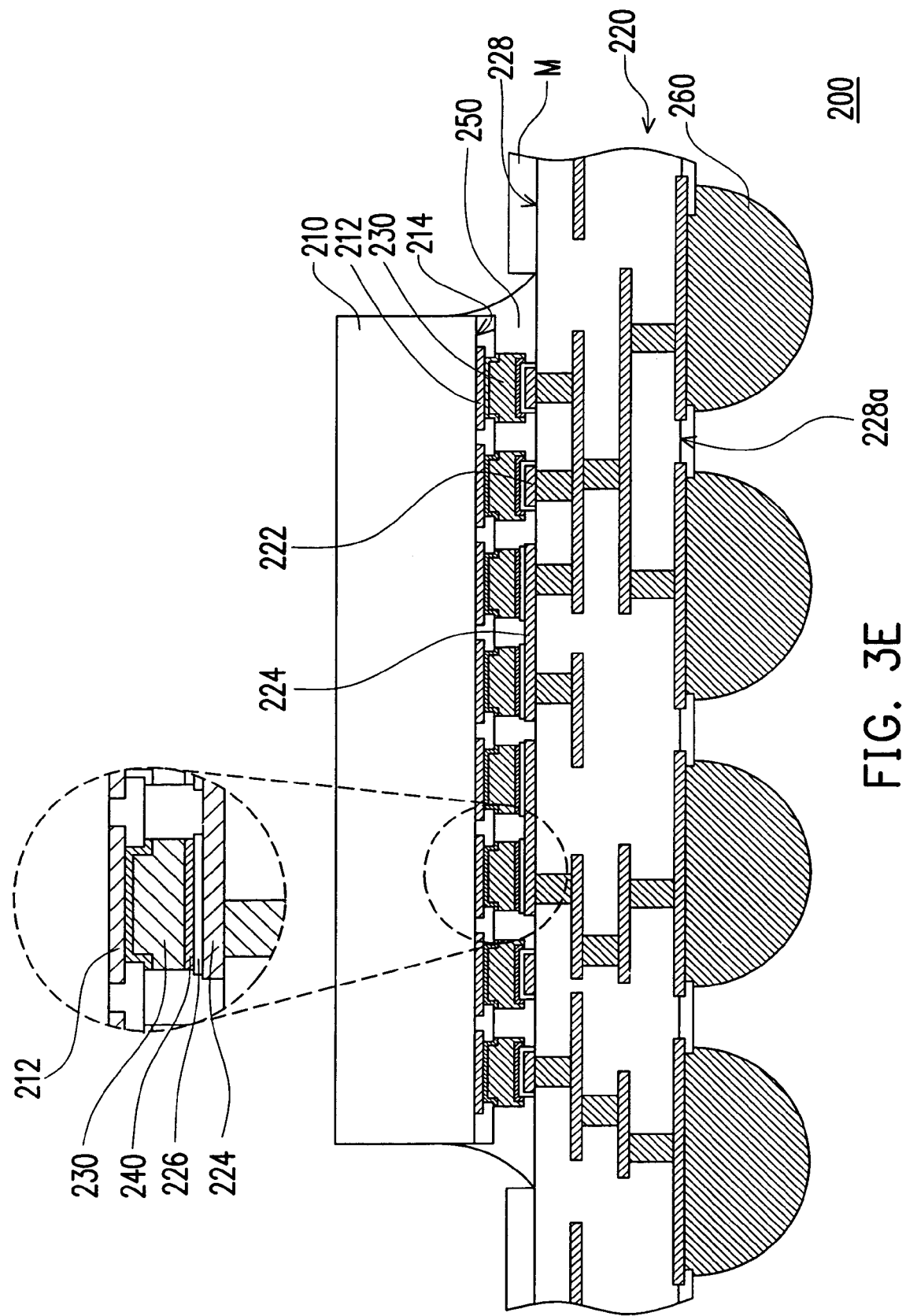

Next, referring to FIG. 3E, an underfill layer 250 is formed between the chip 210 and the package substrate 220, and covers the bumps 230.

After that, a plurality of electrical contacts 260 (for example, conductive balls) is formed on the surface 228a of the package substrate 220 away from the chip 210.

The chip package 200 is completed through the above steps.

The Second Embodiment

Figure 4:
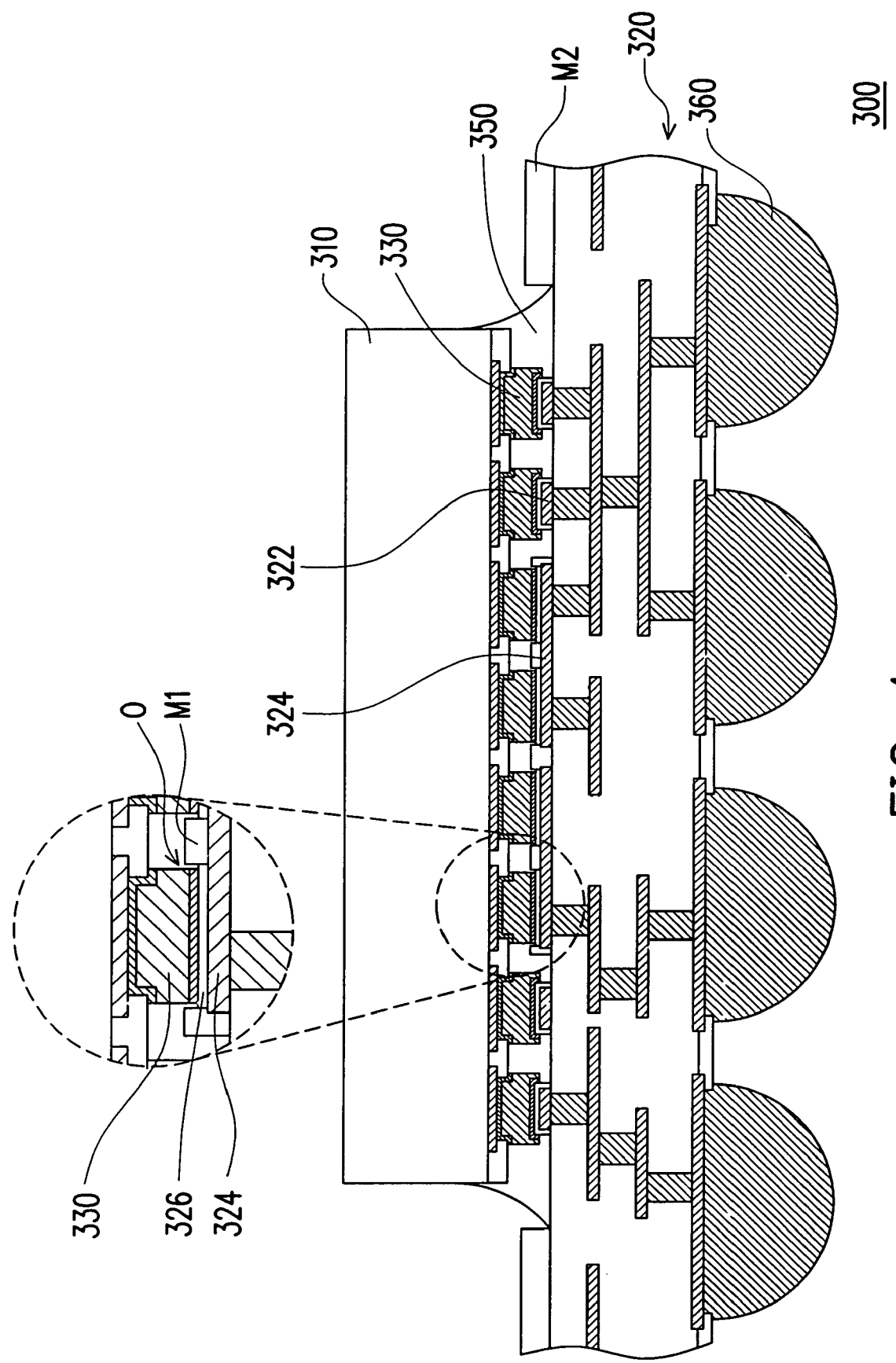
FIG. 4 is a sectional view of a chip package according to the second embodiment of the present invention.

Referring to FIGS. 2 and 4, FIG. 4 is a sectional view of a chip package according to the second embodiment of the present invention. The difference between a chip package 300 of the second embodiment and the chip package 200 of the first embodiment is that a package substrate 320 of the chip package 300 includes two solder mask layers M1 and M2. The function and allocation of the solder mask layer M2 are the same as those of the aforementioned solder mask layer M of the first embodiment. The solder mask layer M1 is disposed on the second substrate pads 324 and has a plurality of openings O. A surface bonding layer 326 disposed on the second substrate pads 324 is located in the openings O.

Further, the method of fabricating the chip package 300 is different from that of the chip package 200. FIGS. 5A to 5D are sectional views of a part of steps of the method of fabricating the chip package as shown in FIG. 4.

Figure 5A:
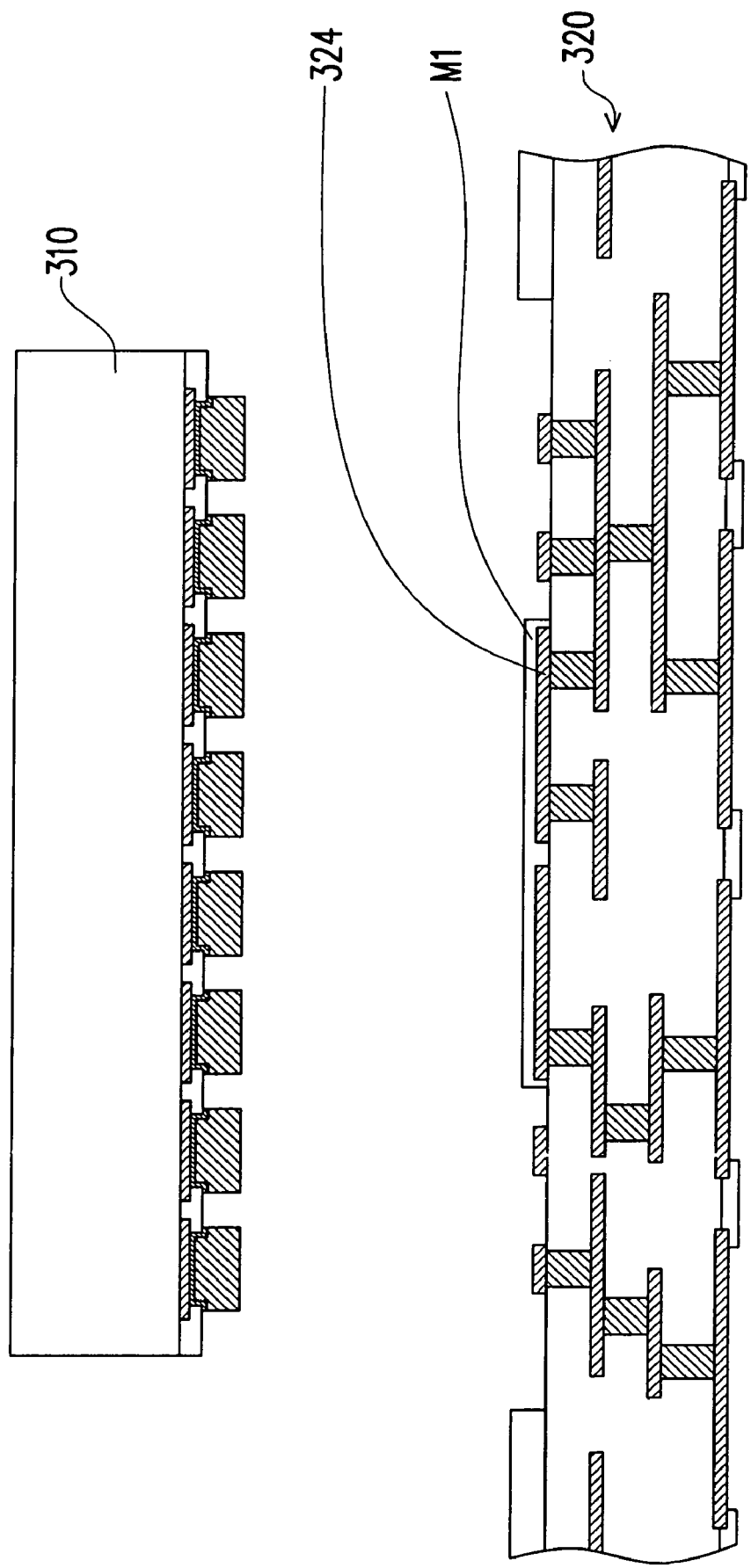
FIGS. 5A to 5D are sectional views of a part of steps of the method of fabricating the chip package as shown in FIG. 4.

After the steps as shown in FIG. 3A and disclosed in the related descriptions, i.e., after the steps of providing a chip 310 and a package substrate 320 in the second embodiment, referring to FIG. 5A, a solder mask layer M1 is formed on the second substrate pads 324.

Figure 5B:
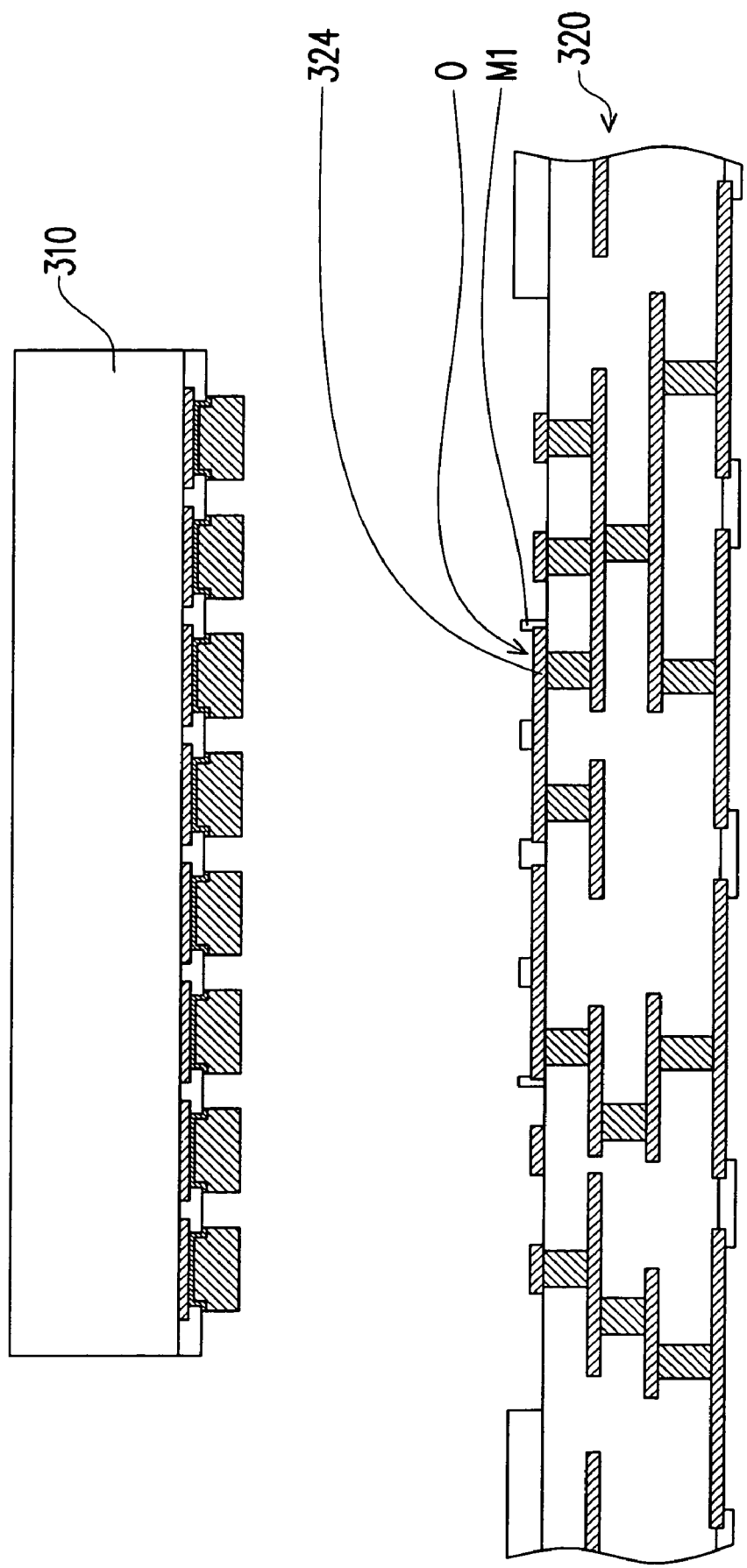

Next, referring to FIG. 5B, the solder mask layer M1 is patterned by, for example, the lithography and etching processes, so as to make the solder mask layer M1 have a plurality of openings O to expose a part of each of the second substrate pads 324.

Figure 5C:
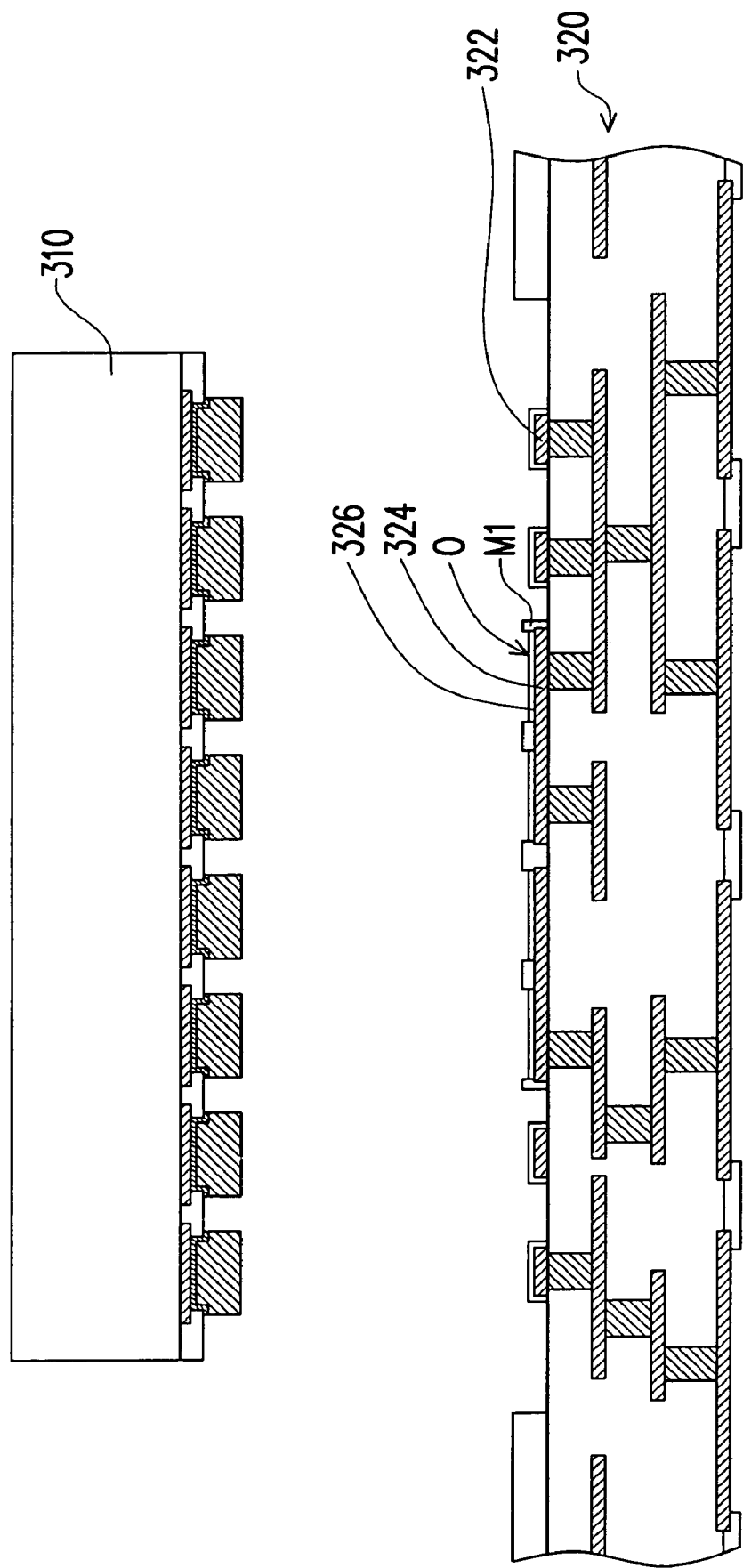

Then, referring to FIG. 5C, a surface bonding layer 326 is formed on the first substrate pads 322 and the second substrate pads 324 by plating or methods other than plating, wherein a part of the surface bonding layer 326 are formed in the openings O respectively, i.e., a part of the surface bonding layer 326 formed on the second substrate pads 324 respectively is located in the openings O respectively.

Figure 5D:
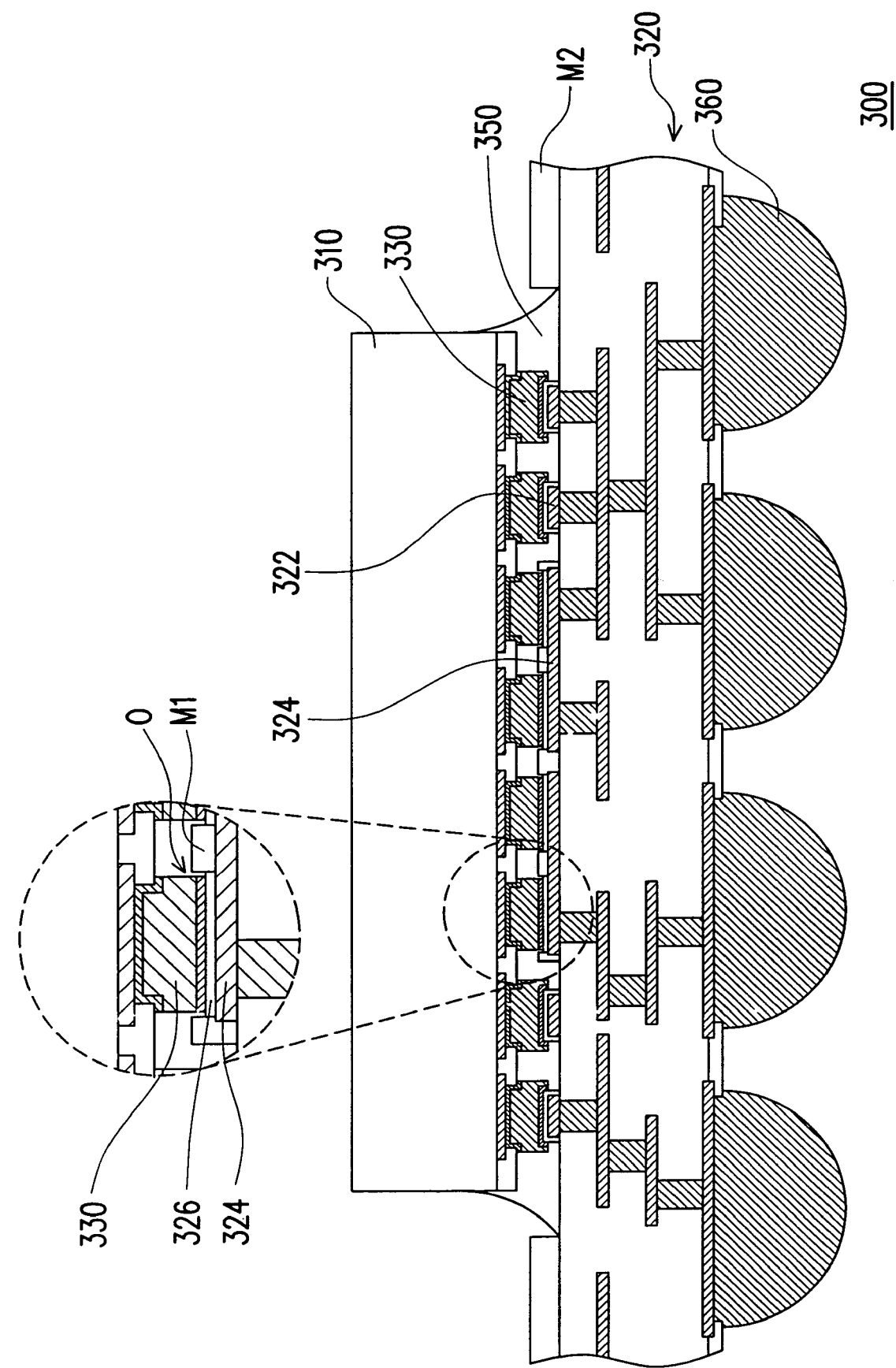

Afterward, referring to FIG. 5D, a thermal compression bonding process is performed to make the bumps 330 bonded to the surface bonding layer 326. The manner of connecting the bumps 330 and the first substrate pads 322 or the second substrate pads 324 and the relation between the melting point of the bumps 330 and the operation temperature of the thermal compression bonding process are the same as those in the first embodiment, and they will not be described herein again.

Then, an underfill layer 350 and a plurality of electrical contacts 360 are formed at the same relative position and in the same manner as those of the first embodiment.

The chip package 300 is completed through the above steps.

The Third Embodiment

Figure 6:
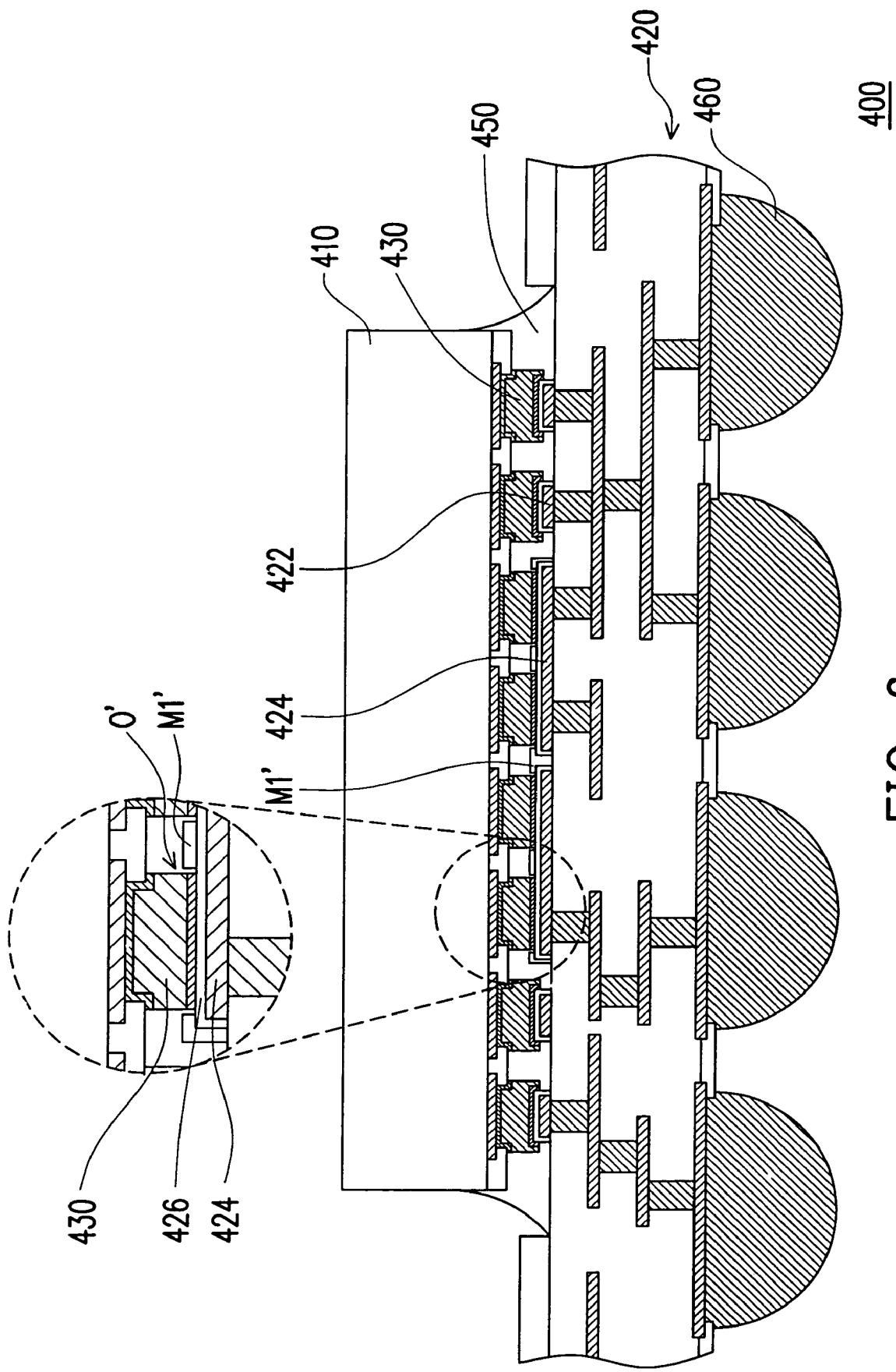
FIG. 6 is a sectional view of a chip package according to the third embodiment of the present invention.

Referring to FIGS. 4 and 6, FIG. 6 is a sectional view of a chip package according to the third embodiment of the present invention. The difference between a chip package 400 of the third embodiment and the chip package 300 of the second embodiment is the arrangement of a solder mask layer M1' and a surface bonding layer 426 of a package substrate 420 of the chip package 400. The surface bonding layer 426 is disposed on the first substrate pads 422 and the second substrate pads 424. The solder mask layer M1' is disposed on the surface bonding layer 426 of the second substrate pads 422 and has a plurality of openings O' to expose the surface bonding layer 426.

Moreover, the method of fabricating the chip package 400 is different from the methods of fabricating the chip packages 200, 300.

FIGS. 7A to 7D are sectional views of a part of steps of the method of fabricating the chip package in FIG. 6.

Figure 7A:
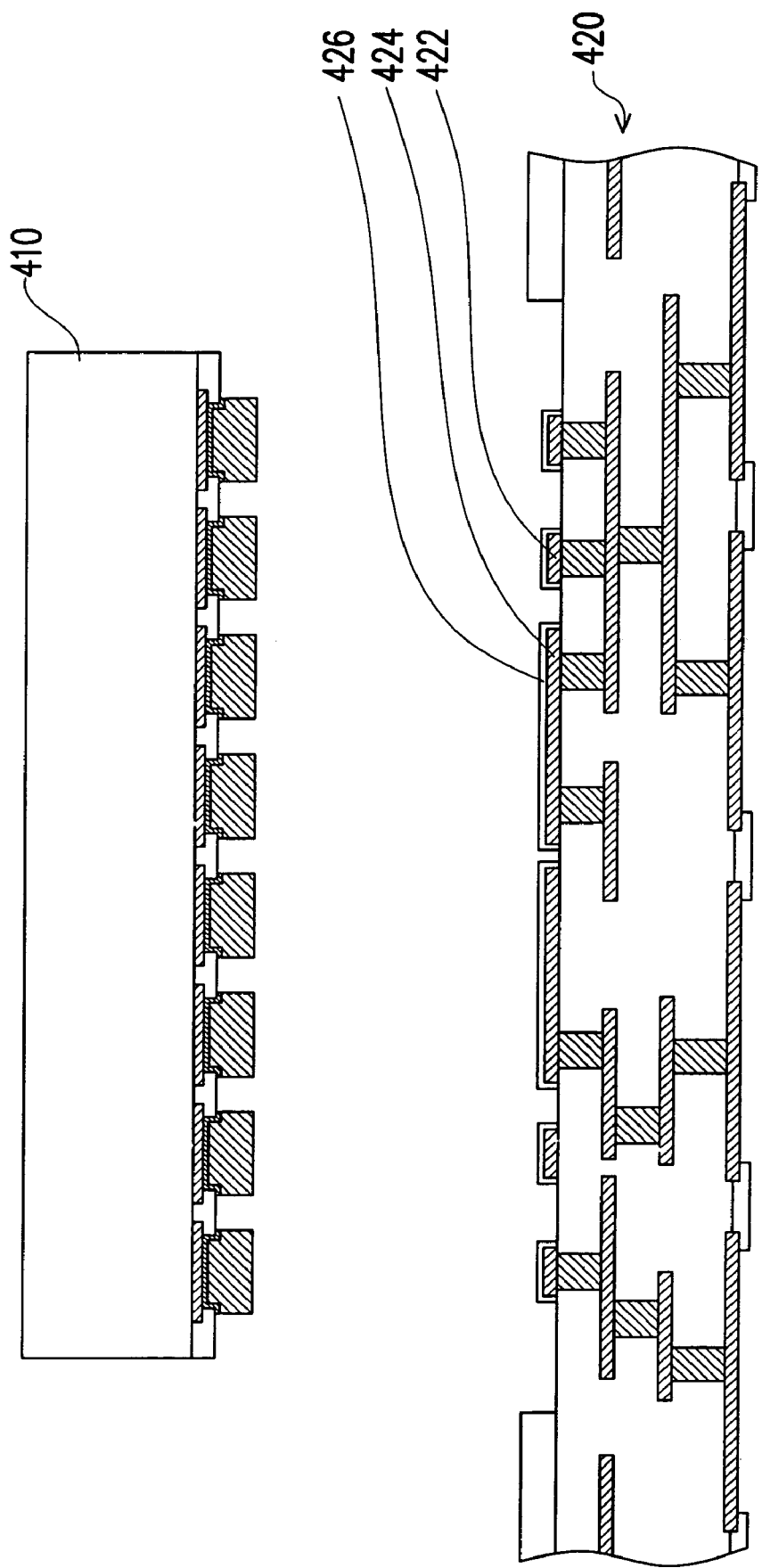
FIGS. 7A to 7D are sectional views of a part of steps of the method of fabricating the chip package in FIG. 6.

After the steps as shown in FIG. 3A and disclosed in the related description, i.e., after the steps of providing a chip 410 and a package substrate 420 in the third embodiment, referring to FIG. 7A, a surface bonding layer 426 is formed on the first substrate pads 422 and the second substrate pads 424 by plating or methods other than plating.

Figure 7B:
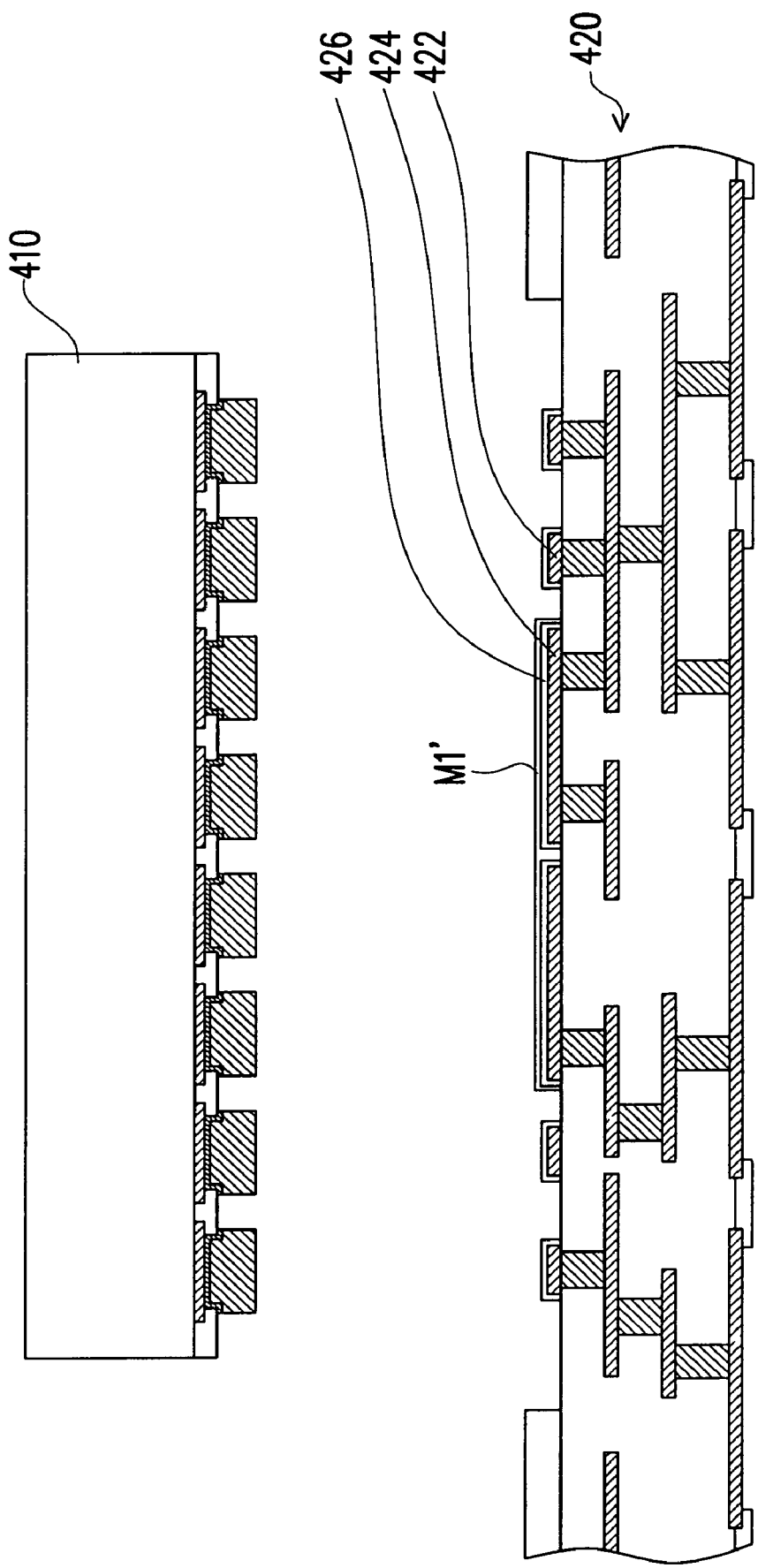

Then, referring to FIG. 7B, a solder mask layer M1' is formed on the surface bonding layer 426 of the second substrate pads 424.

Figure 7C:
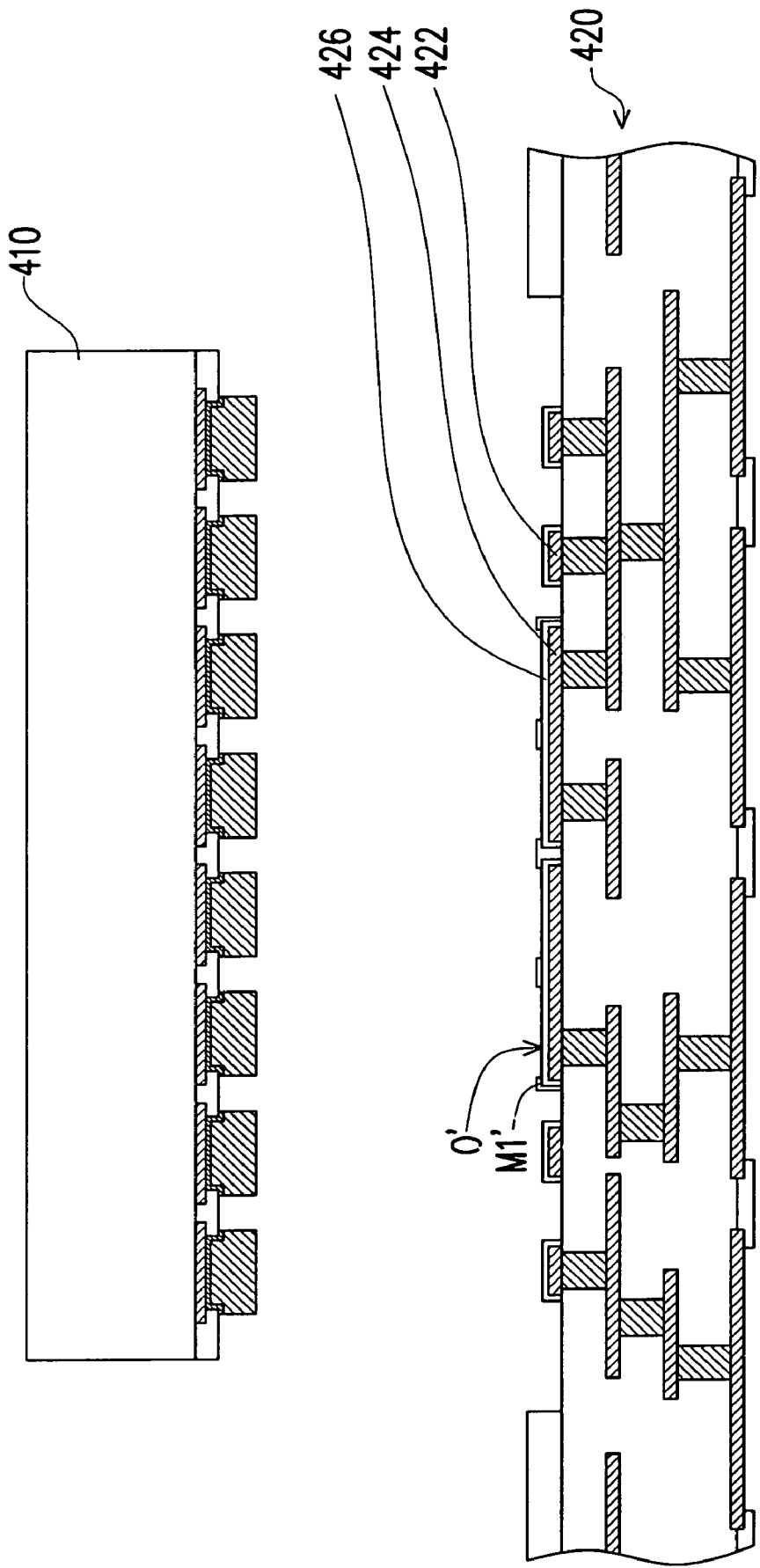

Afterwards, referring to FIG. 7C, the solder mask layer M1' is patterned by the lithography and etching processes to have a plurality of openings O' to expose a part of the surface bonding layer 426.

Figure 7D:
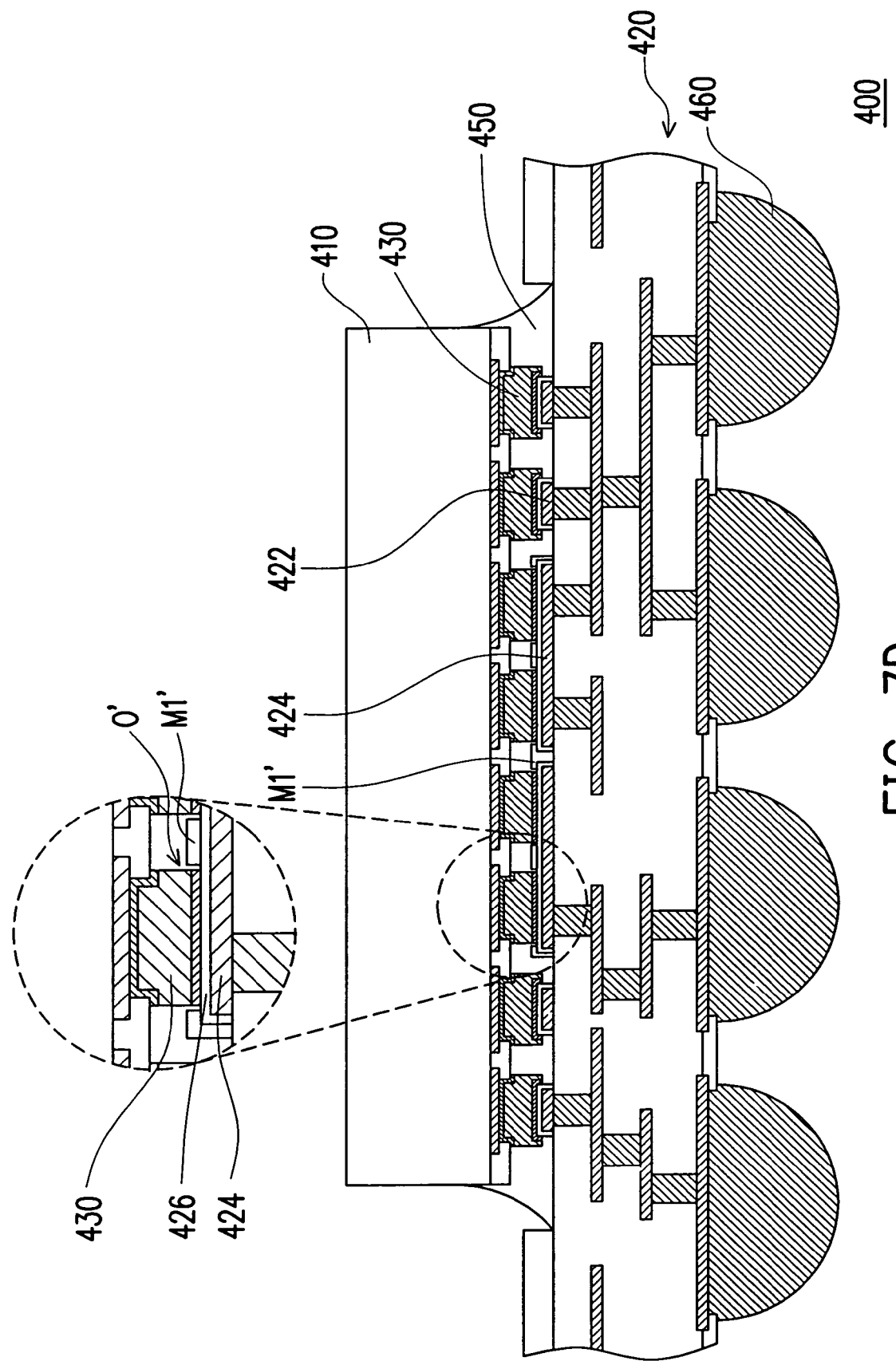

Then referring to FIG. 7D, a thermal compression bonding process is performed to make the bumps 430 bonded to the surface bonding layer 426. The manner of connecting the bumps 430 and the first substrate pads 422 or the second substrate pads 424 and the relation between the melting point of the bumps 430 and the operation temperature of the thermal compression bonding process are the same as those of the first embodiment, and they will not be described herein again.

Then, an underfill layer 450 and a plurality of electrical contacts 460 are formed at the same relative position and in the same manner as those of the first embodiment.

The chip package 400 is completed through the above steps.

In view of the above, according to the chip package and the fabricating method thereof provided by the present invention, the surface bonding layer on the second substrate pads, which is in an area not correspondingly connected to the bumps, is removed or restricted by the solder mask layer, so in the thermal compression bonding process, the surface bonding layer on the second substrate pads may not rise along the side of the bumps toward the chip through the effect of surface tension. Thus, the surface bonding layer on the second substrate pads does not contaminate the chip, thereby maintaining the normal operation of the chip package.

It should be noted that the second substrate pad can be considered having two regions. In the embodiments related to FIG. 2, the surface bonding layer covers only one region, while in the embodiments related FIGS. 4. and 6, the surface bonding layer covers all regions.

Though the present invention has been disclosed above by a plurality of embodiments, they are not intended to limit the invention. Anybody skilled in the art can make some modifications and variations without departing from the spirit and scope of the invention. Therefore, the protecting range of the present invention falls in the appended claims.

What is claimed is:

1. A chip package, comprising:
   a chip having a plurality of chip pads disposed on a surface of the chip;
   a package substrate having a plurality of first substrate pads, a plurality of second substrate pads, and a surface bonding layer, wherein the first substrate pads and the second substrate pads are disposed on a surface of the package substrate, wherein the surface bonding layer is disposed on the first substrate pads and the second substrate pads, wherein the second substrate pad has a first region and a second region, and the surface bonding layer covers the first region of the second substrate pad and does not cover the second region of the second substrate pad; and
   a plurality of bumps disposed between the chip pads and the surface bonding layer, wherein the chip is electrically connected to the package substrate through the bumps, each first substrate pad is electrically connected to one of the bumps, and each second substrate pad is electrically connected to at least two of the bumps,
   wherein the package substrate comprises:
   a first solder mask layer disposed on the second substrate pads, having a plurality of openings and covering the second region of the second substrate pads, and the surface bonding layer being disposed in the openings; and
   a second solder mask layer disposed on the surface of the package substrate and exposing the first substrate pads and the second substrate pads.

2. The chip package according to claim 1, wherein the thickness of the surface bonding layer is less than 5 μm.

3. The chip package according to claim 1, wherein each first substrate pad is partially embedded in one of the bumps.

4. The chip package according to claim 1, wherein the material of the bumps is a lead-free material.

5. The chip package according to claim 4, wherein the material of the bumps comprises Au, Cu, Sn, or Ni.

6. The chip package according to claim 1, further comprising an interface metal layer disposed between the bumps and the surface bonding layer, wherein the melting point of the interface metal layer is lower than that of the bumps.

7. The chip package according to claim 1, wherein the chip pads are disposed on the surface of the chip in a plane array.

8. A chip package, comprising:
   a chip having a plurality of chip pads disposed on a surface of the chip;
   a package substrate having a plurality of first substrate pads, a plurality of second substrate pads, a surface bonding layer and a first solder mask layer, wherein the first substrate pads and the second substrate pads are disposed on a surface of the package substrate, the surface bonding layer is disposed on the first substrate pads and the second substrate pads, the second substrate pad has a first region and a second region, the first solder mask layer disposed on parts of the surface bonding layer respectively on the second substrate pads and having a plurality of openings to expose the surface bonding layer in the first region; and
   a plurality of bumps disposed between the chip pads and the surface bonding layer, wherein the chip is electrically connected to the package substrate through the bumps, each first substrate pad is electrically connected to one of the bumps, and each second substrate pad is electrically connected to at least two of the bumps.

9. The chip package according to claim 8, wherein the thickness of the surface bonding layer is less than 5 μm.

10. The chip package according to claim 8, wherein the package substrate comprises a second solder mask layer disposed on the surface of the package substrate and exposing the first substrate pads and the second substrate pads.

11. The chip package according to claim 8, wherein each first substrate pad is partially embedded in one of the bumps.

12. The chip package according to claim 8, wherein the material of the bumps is a lead-free material.

13. The chip package according to claim 12, wherein the material of the bumps comprises Au, Cu, Sn, or Ni.

14. The chip package according to claim 8, further comprising an interface metal layer disposed between the bumps and the surface bonding layer, wherein the melting point of the interface metal layer is lower than that of the bumps.

15. The chip package according to claim 8, wherein the chip pads are disposed on the surface of the chip in a plane array.

* * * * *